(12) United States Patent
Wang et al.

(10) Patent No.: US 9,966,932 B2
(45) Date of Patent: May 8, 2018

(54) PARALLEL FILTERING METHOD AND CORRESPONDING APPARATUS

(71) Applicant: Institute of Automation, Chinese Academy of Sciences, Beijing (CN)

(72) Inventors: Donglin Wang, Beijing (CN); Leizu Yin, Beijing (CN); Yongyong Yang, Beijing (CN); Shaolin Xie, Beijing (CN); Tao Wang, Beijing (CN)

(73) Assignee: BEIJING SMARTLOGIC TECHNOLOGY LTD., Beijing (CN)

( * ) Notice: Subject to any disclaimer, the term of this patent is extended or adjusted under 35 U.S.C. 154(b) by 202 days.

(21) Appl. No.: 14/785,359

(22) PCT Filed: Apr. 19, 2013

(86) PCT No.: PCT/CN2013/074444
§ 371 (c)(1),
(2) Date: Dec. 15, 2015

(87) PCT Pub. No.: WO2014/169480
PCT Pub. Date: Oct. 23, 2014

(65) Prior Publication Data
US 2016/0233850 A1    Aug. 11, 2016

(51) Int. Cl.
*G06F 17/10* (2006.01)
*H03H 17/02* (2006.01)

(52) U.S. Cl.
CPC . *H03H 17/0223* (2013.01); *H03H 2017/0245* (2013.01); *H03H 2218/10* (2013.01)

(58) Field of Classification Search
CPC .................................................. H03H 17/0223
(Continued)

(56) References Cited

U.S. PATENT DOCUMENTS

| 6,487,572 B2 * | 11/2002 | Kamiya .................. H04S 1/007 708/313 |
| 6,714,956 B1 * | 3/2004 | Liu ..................... H03H 21/0043 708/322 |
| 2012/0054420 A1 | 3/2012 | Kang et al. |

FOREIGN PATENT DOCUMENTS

| CN | 1620108 A | 5/2005 |
| CN | 1672327 A | 9/2005 |

(Continued)

OTHER PUBLICATIONS

International Search Report and Written Opinion for PCT Application No. PCT/CN2013/074444, dated Jan. 23, 2014, 7 pages.

*Primary Examiner* — Tan V. Mai

(74) *Attorney, Agent, or Firm* — Westman, Champlin & Koehler, P.A.

(57) ABSTRACT

An apparatus for parallel filtering, including a multi-granularity memory, a data cache device, a coefficient buffer broadcast device, a vector operation device and a command queue device. The multi-granularity memory is configured to store data to be filtered, filter coefficients and filtering result data. The data cache device is configured to cache, read and update the data to be filtered. The coefficient buffer broadcast device is configured to cache and broadcast the read filter coefficients. The command queue device is configured to store and output a queue of operation commands for the parallel filtering operation. The vector operation device is configured to perform a vector operation based on the data to be filtered and the output coefficient data, and write an operation result into the multi-granularity filtering result storage unit. A method is also provided. The apparatus and method have a fast filtering speed, a smaller number of accesses, an improved usage efficiency, a reduced power consumption and a wide application scope.

7 Claims, 5 Drawing Sheets

(58) Field of Classification Search
USPC .................................................. 708/300–323
See application file for complete search history.

(56) References Cited

FOREIGN PATENT DOCUMENTS

| | | |
|---|---|---|
| CN | 102497174 A | 6/2012 |
| CN | 102510273 A | 6/2012 |
| CN | 102541749 A | 7/2012 |
| CN | 102541774 A | 7/2012 |
| CN | 103227622 A | 7/2013 |

* cited by examiner

| 1 | 2 | 3 | 4 | | 10 | 11 | 12 | 13 | | 19 | 20 | 21 | 22 | | 28 | 29 | 30 | 31 |
|---|---|---|---|---|----|----|----|----|---|----|----|----|----|---|----|----|----|----|
| 5 | 6 | 7 | 8 | | 14 | 15 | 16 | 17 | | 23 | 24 | 25 | 26 | | 32 | 33 | 34 | 35 |
| 9 | 37 | 38 | 39 | | 18 | 46 | 47 | 48 | | 27 | 55 | 56 | 57 | | 36 | 64 | 65 | 66 |
| 40 | 41 | 42 | 43 | | 49 | 50 | 51 | 52 | | 58 | 59 | 60 | 61 | | 67 | 68 | 69 | 70 |
| 44 | 45 | 73 | 74 | | 53 | 54 | 82 | 83 | | 62 | 63 | 91 | 92 | | 71 | 72 | 100 | 101 |
| 75 | 76 | 77 | 78 | | 84 | 85 | 86 | 87 | | 93 | 94 | 95 | 96 | | 102 | 103 | 104 | 105 |
| 79 | 80 | 81 | 109 | | 88 | 89 | 90 | 118 | | 97 | 98 | 99 | 127 | | 106 | 107 | 108 | 136 |
| 110 | 111 | 112 | 113 | | 119 | 120 | 121 | 122 | | 128 | 129 | 130 | 131 | | 137 | 138 | 139 | 140 |
| 113 | 115 | 116 | 117 | | 123 | 124 | 125 | 126 | | 132 | 133 | 134 | 135 | | 141 | 142 | 143 | 144 |

PARALLEL FILTERING METHOD AND CORRESPONDING APPARATUS

CROSS-REFERENCE TO RELATED APPLICATION

This Application is a Section 371 National Stage Application of International Application No. PCT/CN2013/074444, filed 19 Apr. 2013 and published as WO 2014/169480 A1 on 23 Oct. 2014, in Chinese, the contents of which are hereby incorporated by reference in their entirety.

TECHNICAL FIELD

The present disclosure relates to signal processing technology, and more particular to a method for parallel filtering and a circuit implementation thereof in integrated circuit design.

BACKGROUND

Image filtering is indispensable for images having low signal to noise ratio obtained in signal processing systems such as image processing systems.

Currently there are mainly two types of filtering methods. The first type of methods use programmable devices such as FPGA, CPLD and the like, and design filters specific to different application scenarios. Such methods provide some level of real time capability, but cannot achieve a high dominant frequency or have diversified functions due to inherent weakness of the programmable devices. As an example, the patent document (application No. 200310105132) discusses how to implement two-dimensional (2D) filtering using CPLD and single chip microcomputer. This method is based on a 5*5 filtering template, and can be executed in real time. However, when the size of the filtering template is changes, the overall structure has to be redesigned. This method is not flexible or modular. Further, the operating frequency 10 M is low.

The second type of methods use specific DSP or ASIC chips. An image is stored in the form of data array in a memory, and the chips filter the image by processing the data array in the memory. Such methods incur heavy access overhead and are inefficient in filtering operation, because conventional signal processors require repeated loading of data to be filtered.

In the scope of the second type of methods, the present disclosure provide an optimized parallel filtering method and designs a structure for filtering operation by using vector operational components according to the method.

SUMMARY

To address one or more problems with the above conventional technology, the present disclosure provides a method and apparatus for parallel filtering. The present disclosure is applicable to various filtering operations, and enables sufficient parallelization of filtering operation by combining "data cache and coefficient broadcast" mechanism and a parallel operational component having diversified operational modes.

In an aspect of the present disclosure, an apparatus for parallel filtering is provided. The apparatus comprises: a multi-granularity memory 10, a data cache device 20, a coefficient buffer broadcast device 30, a vector operation device 40 and a command queue device 50.

The multi-granularity memory 10 is configured to store data to be filtered and filter coefficients, which are read from a matrix of data to be filtered and a matrix of filter coefficients, respectively, for parallel filtering operation, and filtering result data obtained after the filtering operation. The multi-granularity memory 10 comprises a multi-granularity to-be-filtered data storage unit 101, a multi-granularity filter coefficient storage unit 102 and a multi-granularity filtering result storage unit 103.

The multi-granularity to-be-filtered data storage unit 101 and the multi-granularity filter coefficient storage unit 102 each have a read/write bit width, denoted as BS, identical to an operational size of the vector operation device 40.

The data cache device 20 is configured to cache the data to be filtered as read from the multi-granularity to-be-filtered data storage unit 101, and read and update the cached data. The data cache device 20 comprising a data cache body 201 and a data buffer control unit 202.

The coefficient buffer broadcast device 30 is configured to cache the filter coefficients as read from the multi-granularity filter coefficient storage unit 102, and broadcast the cached data by duplicating the cached data into BS copies to obtain output coefficient data 3001 having a width of BS data elements. The coefficient buffer broadcast device 30 comprises a coefficient buffer entity 301 and a plurality of coefficient buffer control units: a read control logic unit 302, an initialization logic unit 303 and an update logic unit 304.

The command queue device 50 is configured to store and output to the vector operation device 40 a queue of operation commands for the parallel filtering operation.

The vector operation device 40 is configured to perform a vector operation based on the data to be filtered as read from the data cache device 20 and the output coefficient data 3001 as read from the coefficient buffer broadcast device 30, and write an operation result into the multi-granularity filtering result storage unit 103.

In another aspect of the present disclosure, a method for parallel filtering is provided. The method comprises:

Step 1): reading a number, BS, of data to be filtered from a data cache device 20 and a number, BS, of output coefficient data from a coefficient buffer broadcast device 30, the BS data to be filtered being first data of first BS rows in a matrix of data to be filtered, while, in a signal set 4004 for a vector multiplier and accumulator device 40, a read data buffer enabling signal is valid, a column number in a read data buffer column number signal corresponds to a column number of the read data and a read data buffer in-column offset signal is valid, a read coefficient buffer enabling signal 4007 is valid, and a data to be filtered 4001 and output coefficients 4002 are read at an input terminal of the vector multiplier and accumulator device 40;

Step 2): multiplying, at a vector multiplier unit 401, the read output coefficients with the data to be filtered, respectively;

Step 3-1): adding a multiplication result obtained in Step 2) to a current value in a vector accumulating register unit 403 and then proceeding with Step 4);

Step 3-2): determining, while performing Step 3-1), whether the output coefficient data currently read from the coefficient buffer broadcast device 30 is the last output coefficient or not, and if so, updating the coefficient buffer broadcast device 30 and then proceeding with Step 4); otherwise proceeding with Step 4) directly;

Step 4): determining whether a current number of operations equals to a size of a matrix of filter coefficients, and if so, proceeding with Step 6); otherwise proceeding with Step 5);

Step 5): incrementing a counter of a number of times the data cache device 20 or the coefficient buffer broadcast device 30 has been read by 1 and returning to Step 1);

Step 6): writing, by an operation control logic unit 404 of the vector multiplier and accumulator device 40, BS filtering results currently obtained back into a multi-granularity filtering result storage unit 103 and transmitting a shift signal to the coefficient buffer broadcast device 30;

Step 7): processing other data in the first BS rows in the matrix of data to be filtered similarly in accordance with Steps 1)-6); and Step 8): initializing the data cache device 20 and the coefficient buffer broadcast device 30, and processing other data in the matrix of data to be filtered similarly in accordance with Steps 1)-7), until all the data in the matrix of data to be filtered have been processed.

With the present disclosure, the parallelism size of the operations required in the filtering algorithm can be increased since BS operations can be performed simultaneously. That is, one filter coefficient is used each time and, after coefficient broadcast, participates in the operation with BS data to be filtered. After K*K operations, BS filtering results can be obtained according to the present disclosure. In contrast, only one filtering result can be obtained in this case when the conventional method is applied.

Further, the present disclosure has the following advantageous effects:

1): Fast filtering speed. Since the vector multiplier and accumulator device 40 having an operational size of BS is adopted, for every $K^2$ operations, BS 2D matrices of filtering result data can be obtained. That is BS times faster than the conventional implementation.

2): Reduced number of accesses and improved data usage efficiency. According to the present disclosure, the data cache device 20 and the coefficient buffer broadcast device 30 cache the data read from the multi-granularity to-be-filtered data storage unit 101 and the multi-granularity filtering result storage unit 102, so as to reduce the number of storage accesses, reduce the power consumption and improve the data usage efficiency.

3): Wide application scope. By extending the functionality of the vector multiplier and accumulator device 40, various filtering odes can be supported, so as to extend the application scope of the present disclosure.

BRIEF DESCRIPTION OF THE DRAWINGS

FIG. 3 is a schematic diagram showing data distribution of a matrix D of data to be filtered in a multi-granularity to-be-filtered data storage unit 101 according to an embodiment of the present disclosure;

FIG. 4 is a schematic diagram showing data distribution of a matrix T of filter coefficients in a multi-granularity filter coefficient storage unit 102 according to an embodiment of the present disclosure;

DETAILED DESCRIPTION OF THE EMBODIMENTS

In the following, the present disclosure will be further explained with reference to the figures and specific embodiments so that the objects, solutions and advantages of the present disclosure become more apparent.

First of all, the fundamental theory of the filtering operation according to an embodiment of the present disclosure will be introduced with reference to an example of 2D filtering.

In a 2D filtering operation, it is generally assumed that a filter template matrix is H having a size of K*K, where K=2a+1. For an input matrix X having a size of M*N, each element Y(i, j) in the operation result matrix can be calculated according to the following equation:

$$Y(i,j)=\Sigma_{s=-a}^{a}\Sigma_{t=-a}^{a}H(s,t)X(i+s,j+t) \quad (1)$$

where a has a typical value of 1, 2 or 5, i.e., the size of the filter template matrix is 3*3, 5*5 or 7*7.

Figure 1:
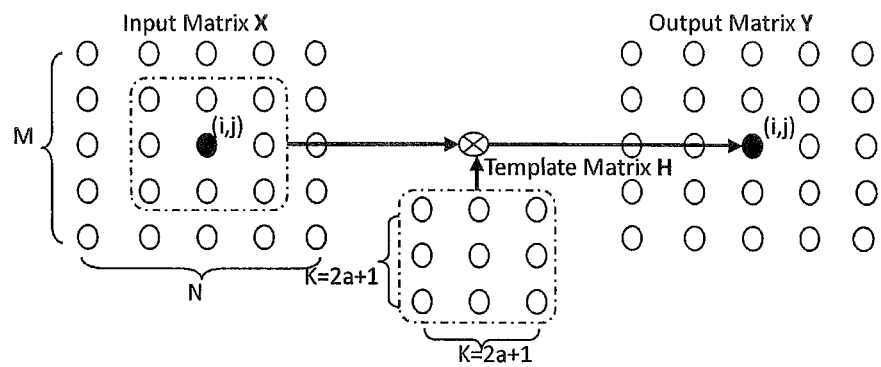
FIG. 1 is a schematic diagram showing a principle of a 2 filtering algorithm.

FIG. 1 is a schematic diagram showing a principle of a 2D filtering algorithm. As shown in FIG. 1, in order to obtain a particular point in the operation result matrix Y, a matrix consisting of a point at the corresponding position in the input matrix X and the points surrounding it is multiplied with the respective points in the filter template matrix H and then accumulated.

The amount of calculation in the 2D filtering varies for different filter templates. Generally, for a K*K filter template, $K^2$ multiplications and $K^2$ additions plus an M*N input matrix are required to calculate each filtering result. Accordingly, the amount of calculation required for the entire filtering algorithm is $2MNK^2$. That is, the 2D filtering is a calculation intensive algorithm.

Figure 2:
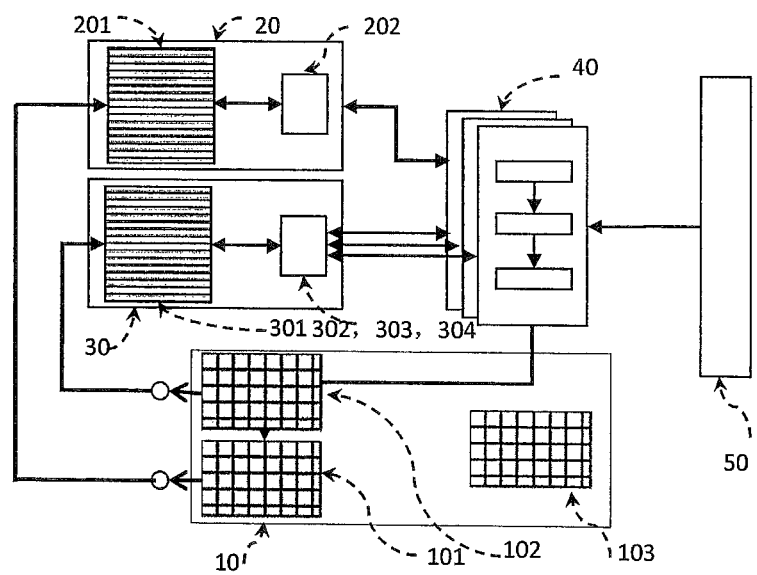
FIG. 2 shows an apparatus for parallel filtering according to an embodiment of the present disclosure.

FIG. 2 shows an apparatus for parallel filtering according to an embodiment of the present disclosure. As shown in FIG. 2, the apparatus for parallel filtering includes a multi-granularity memory 10, a data cache device 20, a coefficient buffer broadcast device 30, a vector operation device 40 and a command queue device 50.

The multi-granularity memory 10 is configured to store data to be filtered and filter coefficients, which are read from a matrix of data to be filtered and a matrix of filter coefficients, respectively, for parallel filtering operation, and filtering result data obtained after the filtering operation. Here, the multi-granularity memory 10 generally includes a multi-granularity to-be-filtered data storage unit 101, a multi-granularity filter coefficient storage unit 102 and a multi-granularity filtering result storage unit 103.

The multi-granularity to-be-filtered data storage unit 101 and the multi-granularity filter coefficient storage unit 102 each have a read/write bit width, denoted as BS, identical to an operational size of the vector operation device 40.

The multi-granularity to-be-filtered data storage unit 101 and the multi-granularity filter coefficient storage unit 102 are existing memories capable of supporting multi-granularity parallel reading/writing. For their detailed descriptions, reference can be made to Chinese Patent Application No. 201110459453.7, entitled "Multi-granularity Parallel Storage System", and Chinese Patent Application No. 201110460585.1, entitled "Multi-granularity Parallel Storage System and Memory".

The data cache device 20 is configured to cache the data to be filtered as read from the multi-granularity to-be-filtered data storage unit 101, and read and update the cached data. Here, the data cache device 20 includes a data cache body 201 and a data buffer control unit 202.

The data cache device 20 is an existing cache device. For details regarding the structure of this cache device, reference can be made to Chinese Patent Application No. 201110443425.6, entitled "Apparatus for Providing Data to Be Filtered".

The coefficient buffer broadcast device 30 is configured to cache the filter coefficients as read from the multi-granularity filter coefficient storage unit 102, and broadcast the cached data by duplicating the cached data into BS=4 copies to obtain output coefficient data 3001 having a width of 4 data elements. Here, the coefficient buffer broadcast device 30 includes a coefficient buffer entity 301 and a plurality of coefficient buffer control units: a read control logic unit 302, an initialization logic unit 303 and an update logic unit 304.

The command queue device 50 is configured to store and output to the vector operation device 40 a queue of operation commands for the parallel filtering operation.

The vector operation device 40 is configured to perform a vector operation based on the data to be filtered as read from the data cache device 20 and the output coefficient data 3001 as read from the coefficient buffer broadcast device 30, and write an operation result into the multi-granularity filtering result storage unit 103. The vector operation device 40 is capable of performing one or more vector operations simultaneously.

In operation, the apparatus for parallel filtering first reads the data to be filtered in the matrix of data to be filtered from the multi-granularity to-be-filtered data storage unit 101 in columns and caches it in the data cache device 20, while reading the filter coefficients in the matrix of filter coefficients from the mufti-granularity filter coefficient storage unit 102 in columns and caching them in the coefficient buffer broadcast device 30. After the above data loading, the vector operation device 40 starts to operate. It reads the data to be filtered from the data cache device 20, reads the output coefficient data 3001 that has been broadcasted from the coefficient buffer broadcast device 30, and then performs the filtering operation on the read data based on the operation commands from the command queue device 50 and writes the operation result into the multi-granularity filtering result storage unit 103.

As described above, the operational size of the vector operation device 40 is identical to the read/write bit width of the multi-granularity to-be-filtered data storage unit 101 and the multi-granularity filter coefficient storage unit 102. That is, the vector operation device 40 can perform S operations concurrently and can write BS operation results into the multi-granularity filtering result storage unit 103 at a time. In fact, the BS operation results are filtering operations for the first elements in the first BS rows of the matrix of data to be filtered. Similarly, the other elements of the first BS rows can be processed in pipeline. Then, the data cache device 20 and the coefficient buffer broadcast device 30 can be re-initialized to obtain the filtering results for elements in other rows of the matrix of data to be filtered, and write them back into the multi-granularity filtering result storage unit 103.

In an embodiment of the present disclosure, the filtering operation is 2D filtering. In this case, the vector operation device 40 is a vector multiplier and accumulator device. The read/write bit width of the multi-granularity to-be-filtered data storage unit 101 and the multi-granularity filtering result storage unit 103, or the operational size of the vector multiplier and accumulator device 40, is S=4. The matrix of data to be filtered is a 17*9 matrix and the matrix T of filter coefficients is a 3*3 matrix, as follows:

$$D = \begin{pmatrix} 1 & 2 & 3 & 4 & 5 & 6 & 7 & 8 & 9 \\ 10 & 11 & 12 & 13 & 14 & 15 & 16 & 17 & 18 \\ 19 & 20 & 21 & 22 & 23 & 24 & 25 & 26 & 27 \\ 28 & 29 & 30 & 31 & 32 & 33 & 34 & 35 & 36 \\ 37 & 38 & 39 & 40 & 41 & 42 & 43 & 44 & 45 \\ 46 & 47 & 48 & 49 & 50 & 51 & 52 & 53 & 54 \\ 55 & 56 & 57 & 58 & 59 & 60 & 61 & 62 & 63 \\ 64 & 65 & 66 & 67 & 68 & 69 & 70 & 71 & 72 \\ 73 & 74 & 75 & 76 & 77 & 78 & 79 & 80 & 81 \\ 82 & 83 & 84 & 85 & 86 & 87 & 88 & 89 & 90 \\ 91 & 92 & 93 & 94 & 95 & 96 & 97 & 98 & 99 \\ 100 & 101 & 102 & 103 & 104 & 105 & 106 & 107 & 108 \\ 109 & 110 & 111 & 112 & 113 & 114 & 115 & 116 & 117 \\ 118 & 119 & 120 & 121 & 122 & 123 & 124 & 125 & 126 \\ 127 & 128 & 129 & 130 & 131 & 132 & 133 & 134 & 135 \end{pmatrix} \quad T = \begin{pmatrix} 1 & 2 & 3 \\ 4 & 5 & 6 \\ 7 & 8 & 9 \end{pmatrix}.$$

FIGS. 3 and 4 show data distribution of the matrix D of data to be filtered in the multi-granularity to-be-filtered data storage unit 101 and data distribution of the matrix T of filter coefficients in the multi-granularity filter coefficient storage unit 102, respectively. Here, the multi-granularity to-be-filtered data storage unit 101 and the multi-granularity filter coefficient storage unit 102 each have a read/write granularity parameter g=1 and a read/write bit width W=4. That is, the storage unit can read/write 4 data each time. As can be seen in FIG. 3, the data in every four rows of the matrix D of data to be filtered are placed to the respective storage block of the multi-granularity to-be-filtered data storage unit 101 in sequence, such that every BS=4 rows of data can be read out in columns. Also, as can be seen in FIG. 4, the matrix T of filter coefficients is stored in the multi-granularity filter coefficient storage unit 102 in columns, such that all the data in the matrix T of filter coefficients can be obtained by reading the multi-granularity filter coefficient storage unit 102 in columns for three times.

Figure 5:
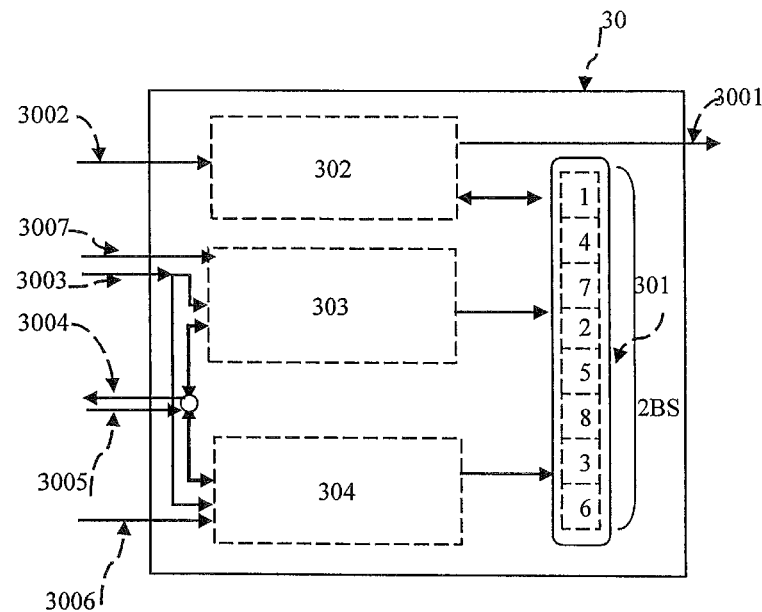
FIG. 5 is a block diagram showing a structure of a coefficient buffer broadcast device 30 according to an embodiment of the present disclosure, as well as data distribution of filter coefficients in a buffer entity 301.

Before explaining the distribution of the filter coefficients in the coefficient buffer broadcast device 30, the respective components of the coefficient buffer broadcast device 30 will be introduced first. As shown in FIG. 5, the coefficient buffer broadcast device 30 includes a coefficient buffer entity 301 and a plurality of coefficient buffer control units: a read control logic unit 302, an initialization logic unit 303 and an update logic unit 304.

Here, the coefficient buffer entity 301 is configured to cache the filter coefficients in the matrix T of filter coefficients. It has a size of 2BS data elements. When BS=4, the size of the coefficient buffer entity 301 is 8 data elements.

The read control logic unit 302 is configured to control an operation to read the coefficient buffer entity 301.

The initialization logic unit 303 is configured to initialize the coefficient buffer entity 301, i.e., to read the respective filter coefficients from the multi-granularity filter coefficient storage unit 102 and store them in the coefficient buffer entity 301, when an initialization start signal 3007, which is an input signal to the coefficient buffer broadcast device 30, becomes valid.

The update logic unit 304 is configured to read, when the coefficient buffer entity 301 is not sufficient for holding all the filter coefficients in the multi-granularity filter coefficient storage unit 102, excessive filter coefficients from the multi-granularity filter coefficient storage unit 102 and store them in the coefficient buffer entity 301.

The input signal to the coefficient buffer broadcast device 30 includes: a read enabling signal 3002, a filter coefficient number indicator signal 3003, the data 3005 read from the multi-granularity to-be-filtered data storage unit 101 by the initialization logic unit 303 or the update logic unit 304, an update signal 3006 transmitted from the vector multiplier and accumulator device 40 to the coefficient buffer broadcast device 30, and the initialization start signal 3007. The output signal includes: a read request, read granularity and read address signal 3004 from the initialization logic unit 303 or the update logic unit 304 to the multi-granularity to-be-filtered data storage unit 101, and the output coefficient data 3001 obtained by broadcasting the data read from the coefficient buffer entity 301, i.e., by duplicating it into BS=4 copies, by the read control logic unit 302. The output coefficient data 3001 has a width of four data elements.

With the above components, the coefficient buffer broadcast device 30 achieves the following functions:

1): Each time the coefficient buffer broadcast device 30 is read, a broadcast result for one data element can be obtained (i.e., the data element is duplicated into BS copies) and transmitted to the operation device.

2) The coefficient buffer broadcast device 30 can be read multiple times at periods equal to the number of filter coefficients, so as to return data elements periodically.

3) When the buffer entity 301 is not sufficient for holding all the filter coefficients, the update logic unit 304 can update the values of the buffer entity 301 for the filtering operation by the vector multiplier and accumulator device 40.

FIG. 5 also shows data distribution of the filter coefficients in the buffer entity 301 when the coefficient buffer broadcast device 30 has been initialized. As shown in FIG. 5, the coefficient buffer broadcast device 30 has a size of 8 data elements, and the number of data elements included in the matrix T of filter coefficients is 9. Hence, in operation, the vector multiplier and accumulator device 40 needs to transmit the update signal to the coefficient buffer broadcast device 30 to update the coefficient buffer broadcast device 30 and then read the remaining filter coefficients for storing in the buffer entity 301 of the coefficient buffer broadcast device 30.

Figure 6:
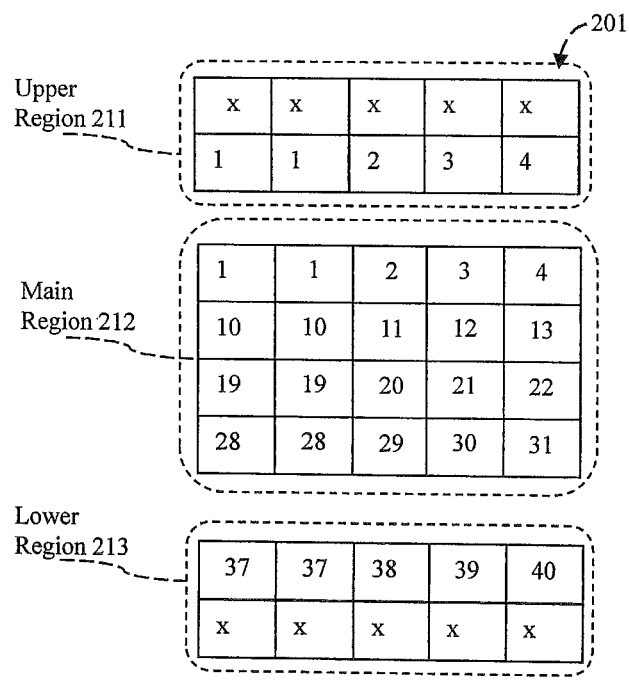
FIG. 6 is a schematic diagram showing data distribution of some elements of a matrix D of data to be filtered in a data cache device according to an embodiment of the present disclosure.

FIG. 6 shows data distribution of some elements of the matrix D of data to be filtered in the data cache device 20 when the initialization for the data cache device 20 to load the data in rows 1~4 of the matrix D of data to be filtered has completed according to an embodiment of the present disclosure. As can be seen in FIG. 6, in the data cache device 20, the data cache body includes an upper region 211, a lower region 213 and a main region 212. The data to be filtered is distributed over columns 2~5 of the main region 212. The first columns of the upper region 211, the lower region 213 and the main region 212 are boarder elements required for filtering a particular point in the filtering operation.

Figure 7:
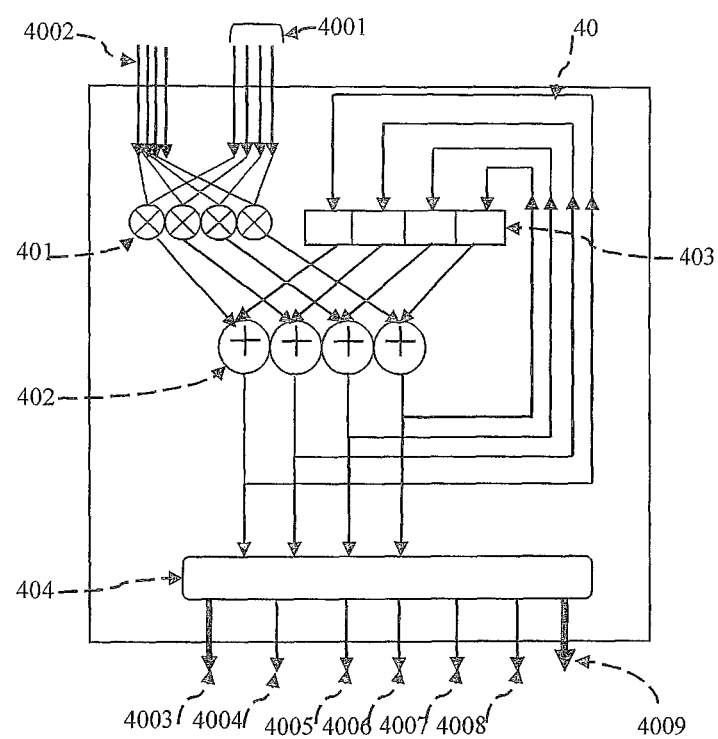
FIG. 7 is a block diagram showing a structure of a vector multiplier and accumulator device 40 according to an embodiment of the present disclosure.

FIG. 7 is a block diagram showing the structure of the vector multiplier and accumulator device 40 according to an embodiment of the present disclosure. As shown in FIG. 7, the vector multiplier and accumulator device 40 includes a vector multiplier unit 401, a vector adder unit 402, a vector accumulating register unit 403 and an operation control logic unit 404.

The vector multiplier unit 401 and the vector adder unit 402 each have an operational size of BS=4 data elements and the vector accumulating register unit 403 can store BS=4 result values.

The input signal to the vector multiplier and accumulator device 40 includes: the data to be filtered 4001 as read from the data cache device 20 and the output coefficient data 4002 (i.e., the output coefficient data 3001 as mentioned above) as read from the coefficient buffer broadcast device 30, each having a width of BS=4 data elements.

The operation control logic unit 404 is configured to transmit to the data cache device 20 an initialization start signal 4003 comprising a signal set 4004, including a read data buffer enabling signal, a read data buffer column number signal and a read data buffer in-column offset signal, and a column shift signal 4005, transmit to the coefficient buffer broadcast device 30 an initialization start signal 4006 (i.e., the initialization start signal 3007 as mentioned above), a read coefficient buffer enabling signal 4007 and an update signal 4008 (i.e., the update signal 3006 as mentioned above), and write the filtering result back into the multi-granularity filtering result storage unit 103. Further, the signal 4009 is a signal set indicating a granularity signal, data and address at which the filtering result is written into the multi-granularity filtering result storage unit 103.

The vector multiplier and accumulator device 40 operates as follows.

First, it reads the data from the data cache device 20 and the coefficient buffer broadcast device 30 as operands for multiplying operation by the vector multiplier unit 401.

Then, it adds an operation result at the vector multiplier unit 401 to a current value at the vector accumulating register unit 403 by using the vector adder unit 402.

Finally, it generates and writes every BS=4 filtering results back into the multi-granularity filtering result storage unit 103 under control of the operation control logic unit 404.

Figure 8:
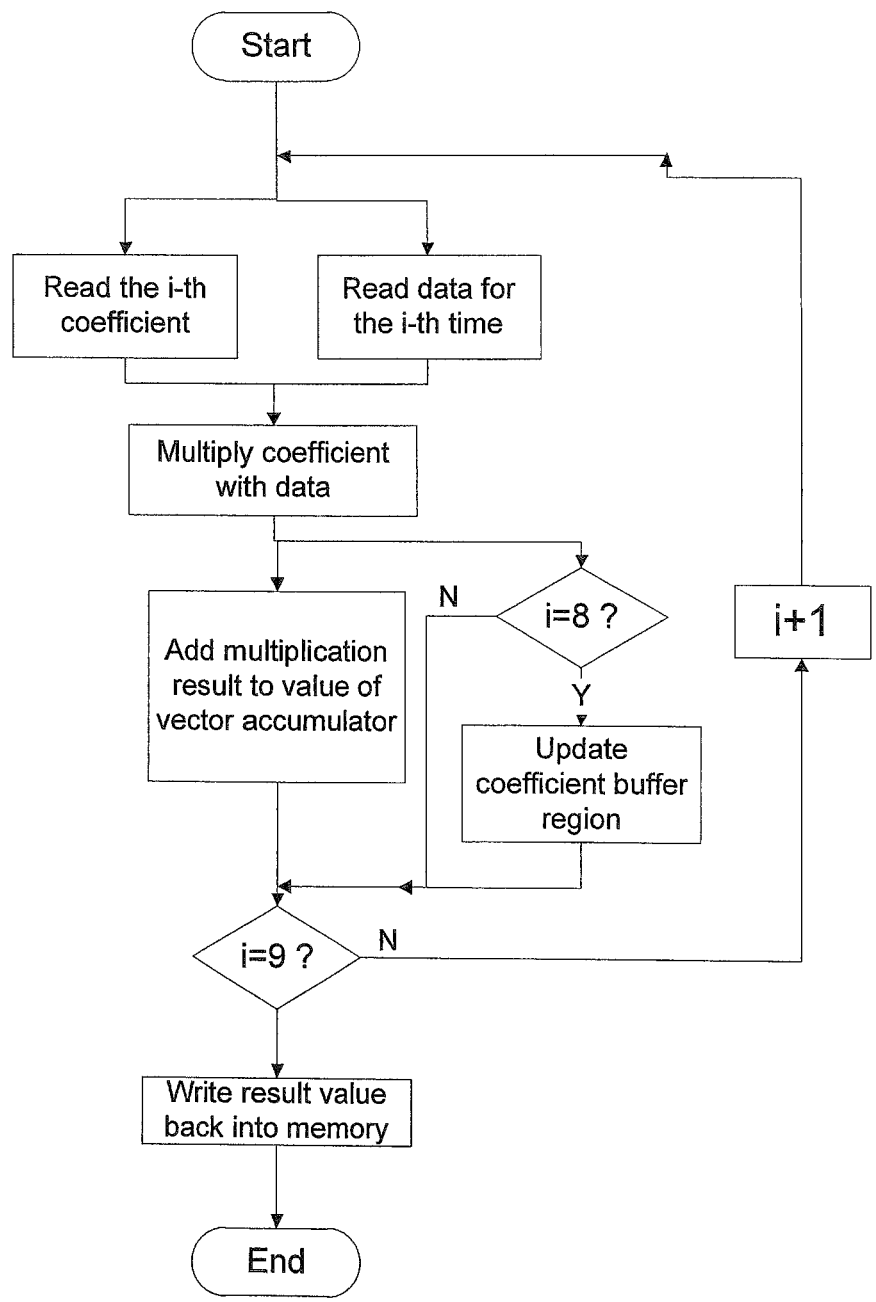
FIG. 8 is a flowcharting illustrating a process for calculating BS filtering results according an embodiment of the present disclosure.

FIG. 8 is a flowcharting illustrating a process for calculating BS filtering results according an embodiment of the present disclosure. The transition to each branch in the flowchart is controlled by the operation control logic unit 404. As can be seen in FIG. 8, the process for calculating BS filtering results includes the following steps.

Step 1): A number, BS, of data to be filtered are read from a data cache device 20 and a number, BS, of output coefficient data are read from a coefficient buffer broadcast device 30. The BS data to be filtered are the first data of first BS rows in a matrix of data to be filtered.

Here, BS=4 data to be filtered can be read from the data cache device 20 and 4 identical output coefficient data, obtained by broadcasting one filter coefficient, can be read from the coefficient buffer broadcast device 30.

Referring to FIG. 7, meanwhile the vector multiplier and accumulator device 40 operates such that: in a signal set 4004, a read data buffer enabling signal is valid, a column number in a read data buffer column number signal corresponds to a column number of the read data and a read data buffer in-column offset signal is valid, and a read coefficient buffer enabling signal 4007 is valid. A data to be filtered 4001 and output coefficients 4002 are read at an input terminal of the vector multiplier and accumulator device 40.

Step 2): At a vector multiplier unit 401, the read output coefficients are multiplied with the BS=4 data to be filtered, respectively.

Step 3-1): A multiplication result obtained in Step 2) is added to a current value in a vector accumulating register unit 403. Then the process proceeds with Step 4).

Step 3-2): While performing Step 3-1), it is determined whether the output coefficient data currently read from the coefficient buffer broadcast device 30 is the last output coefficient in the coefficient buffer broadcast device 30 or not, i.e., whether i=8. If so, the coefficient buffer broadcast device 30 is updated, i.e., the update signal 4008 is controlled to be valid by the operation control logic unit 404 and then the process proceeds with Step 4). Otherwise, i.e., when it proceeds with Step 4) directly.

Step 4): It is determined whether a current number of operations equals to a size of a matrix of filter coefficients. If so, all the filter coefficients have been to multiplied with the respective data to be filtered and BS=4 filtering results have been obtained, and then the process proceeds with Step 6). When the current number of operations does not equal to the size of the matrix of filter coefficients, the process proceeds with Step 5).

Step 5): A counter of a number of times the data cache device 20 or the is coefficient buffer broadcast device 30 has been read is incremented by 1 and the process returns to Step 1).

Step 6): In this case, the output terminal of the vector multiplier and accumulator device 40 operates such that: the operation control logic unit 404 writes BS filtering results currently obtained back into a multi-granularity filtering result storage unit 103 and transmits a shift signal to the coefficient buffer broadcast device 30 to cause the column shift signal 4005 to be valid.

With the above steps, the present disclosure can obtain the first data in the first BS=4 rows of the matrix of filtering results and write the to the specified addresses. Then, the other data in the first BS=4 rows can be processed in a pipeline.

Step 7): The other data in the first BS rows in the matrix of data to be filtered are processed similarly in accordance with Steps 1)-6).

The rows 1~4 in the matrix of data to be filtered have been filtered above. Then, the data cache device 20 and the coefficient buffer broadcast device 30 need to be re-initialized to process the rows 5~8 and other rows in the matrix of data to be filtered according to the process shown in FIG. 8 as described above, until all the data in the matrix of data to be filtered have been processed. That is:

Step 8): The data cache device 20 and the coefficient buffer broadcast device 30 are initialized to process other data in the matrix of data to be filtered similarly in accordance with Steps 1)-7), until all the data in the matrix of data to be filtered have been processed.

In the above process, it is assumed that BS=4 as an example. However, it can be appreciated by those skilled in the art that the present disclosure is not limited to the scenario where BS=4. Accordingly, the present disclosure also applies to other 2D filtering methods and apparatuses in which the respective widths of the multi-granularity memory, the vector multiplier and accumulator device, the coefficient buffer broadcast device and the data cache device vary synchronously.

Further, the present disclosure is not limited to 2D filtering, but also applies to operations having the following features:

1. The objects of the operation are an input signal matrix and an input coefficient matrix. Here the input coefficient matrix is typically represented in a regular structure, such as a rectangular window or a cross window.

2. The operation has such a feature that an output result for each point is an operation result obtained by operating the input coefficient matrix window and the corresponding part of the input signal matrix. Then the operation is applied to the input matrix on a per point basis, until the entire operation result matrix is obtained.

3. There can be various forms of operations for the input coefficient matrix window and the corresponding part of the input signal matrix. For example, in a 2D filtering structure, the form of operation can be such that corresponding elements in the input matrix window are multiplied with each other and then the respective multiplication results are accumulated to obtain a filtering result for one point. In a Sum of Absolute Difference (SAD) operation in image processing, the form of operation can be such that a difference between corresponding elements in the input matrix window is calculated, then the absolute value of the difference is obtained, and finally the respective absolute values are summed to obtain a filtering result for one point.

The foregoing description of the embodiments illustrates the objects, solutions and advantages of the present disclosure. It will be appreciated that the foregoing description refers to specific embodiments of the present disclosure, and should not be construed as limiting the present disclosure. Any changes, substitutions, modifications and the like within the spirit and principle of the present disclosure shall fall into the scope of the present disclosure.

What is claimed is:

1. An apparatus for parallel filtering comprising: a multi-granularity memory, a data cache device, a coefficient buffer broadcast device (30), a vector operation device and a command queue device, wherein:

the multi-granularity memory is configured to store data to be filtered and filter coefficients, which are read from a matrix of data to be filtered and a matrix of filter coefficients, respectively, for parallel filtering operation, and filtering result data obtained after the filtering operation, the multi-granularity memory comprising a multi-granularity to-be-filtered data storage unit, a multi-granularity filter coefficient storage unit and a multi-granularity filtering result storage unit;

wherein multi-granularity to-be-filtered data storage unit and the multi-granularity filter coefficient storage unit each have a read/write bit width, denoted as BS, identical to an operational size of the vector operation device;

wherein the vector operation device is configured to execute BS operations, and write BS results into the multi-granularity to-be-filtered data storage unit and the multi-granularity filter coefficient storage unit simultaneously;

the data cache device is configured to cache the data to be filtered as read from the multi-granularity to-be-filtered data storage unit, and read and update the data to be filtered, the data cache device comprising a data cache body and a data buffer control unit;

the coefficient buffer broadcast device is configured to cache the filter coefficients as read from the multi-granularity filter coefficient storage unit, and broadcast the data to be filtered by duplicating the data to be filtered into BS copies to obtain output coefficient data having a width of BS data elements, the coefficient buffer broadcast device comprising a coefficient buffer entity and a plurality of coefficient buffer control units: a read control logic unit, an initialization logic unit and an update logic unit;

the command queue device is configured to store and output to the vector operation device a queue of operation commands for the parallel filtering operation; and the vector operation device is configured to perform a vector operation based on the data to be filtered as read from the data cache device and the output coefficient data as read from the coefficient buffer broadcast device, and write an operation result into the multi-granularity filtering result storage unit;

wherein the coefficient buffer entity is configured to cache the filter coefficients in the matrix of filter coefficients;

the read control logic unit is configured to control an operation to read the coefficient buffer entity;

the initialization logic unit is configured to initialize the coefficient buffer entity when an initialization start signal, which is an input signal to the coefficient buffer broadcast device, becomes valid; and the update logic unit is configured to read, when the coefficient buffer entity is not sufficient for holding all the filter coefficients in the multi-granularity filter coefficient storage unit, excessive filter coefficients from the multi-granularity filter coefficient storage unit and store them in the coefficient buffer entity.

2. The apparatus of claim 1, wherein, in operation, the apparatus first reads the data to be filtered in the matrix of data to be filtered from the multi-granularity to-be-filtered data storage unit in columns and caches it in the data cache device, while reading the filter coefficients in the matrix of filter coefficients from the multi-granularity filter coefficient storage unit in columns and caching them in the coefficient buffer broadcast device; the vector operation device is configured to read the data to be filtered from the data cache device, read the output coefficient data that has been broadcasted from the coefficient buffer broadcast device, and then perform the filtering operation on the read data based on the operation commands from the command queue device and write the operation result into the multi-granularity filtering result storage unit.

3. The apparatus of claim 1, wherein the data cache body comprises an upper region, a lower region and a main region, the data to be filtered being distributed over the main region, the first columns of the upper region.

4. The apparatus of claim 1, wherein the input signal to the coefficient buffer broadcast device comprises: a read enabling signal, a filter coefficient number indicator signal, the data read from the multi-granularity to-be-filtered data storage unit by the initialization logic unit or the update logic unit, an update signal transmitted from the vector multiplier and vector operation device to the coefficient buffer broadcast device, and the initialization start signal;

an output signal comprises: a read request, read granularity and read address signal from the initialization logic unit or the update logic unit to the multi-granularity to-be-filtered data storage unit, and the output coefficient data obtained by broadcasting the data read from the coefficient buffer entity by the read control logic unit.

5. The apparatus of claim 1, wherein the vector operation device is a vector multiplier and accumulator device:

wherein the vector multiplier and accumulator device comprises a vector multiplier unit, a vector adder unit, a vector accumulating register unit and an operation control logic unit, wherein the vector multiplier unit and the vector adder unit each have an operational size of BS data elements and the vector accumulating register unit is configured to store BS result values; and the operation control logic control is configured to transmit to the data cache device an initialization start signal comprising a signal set, including a read data buffer enabling signal, a read data buffer column number signal and a read data buffer in-column offset signal, and a column shift signal, transmit to the coefficient buffer broadcast device an initialization start signal, a read coefficient buffer enabling signal and an update signal, and write the filtering result back into the multi-granularity filtering result storage unit.

6. The apparatus of claim 5, wherein the vector multiplier and accumulator device is configured to:

first read the data to be filtered and the output coefficient data from the data cache device and the coefficient buffer broadcast device as operands for multiplying operation by the vector multiplier unit;

then add an operation result at the vector multiplier unit to a current value at the vector accumulating register unit by the vector adder unit; and finally generate and write every BS filtering results back into the multi-granularity filtering result storage unit under control of the operation control logic unit.

7. A method for parallel filtering used in the apparatus of claim 1, the method comprising:

Step 1): reading a number, BS, of data to be filtered from a data cache device and a number, BS, of output coefficient data from a coefficient buffer broadcast device, the BS data to be filtered being first data of first BS rows in a matrix of data to be filtered, while, in a signal set for a vector multiplier and accumulator device, a read data buffer enabling signal is valid, a column number in a read data buffer column number signal corresponds to a column number of the read data and a read data buffer in-column offset signal is valid, a read coefficient buffer enabling signal is valid, and the data to be filtered and the output coefficients are read at an input terminal of the vector multiplier and accumulator device;

Step 2): multiplying, at the vector multiplier unit, the read output coefficients with the data to be filtered, respectively;

Step 3-1): adding a multiplication result obtained in Step 2) to a current value in a vector accumulating register unit and then proceeding with Step 4);

Step 3-2): determining, while performing Step 3-1), whether the output coefficient data currently read from the coefficient buffer broadcast device is the last output coefficient or not, and if so, updating the coefficient buffer broadcast device and then proceeding with Step 4); otherwise proceeding with Step 4) directly, wherein the updating comprises enabling an update signal by the operation control logic unit;

Step 4): determining whether a current number of operations equals to a size of a matrix of filter coefficients, and if so, proceeding with Step 6); otherwise proceeding with Step 5);

Step 5): incrementing a counter of a number of times the data cache device or the coefficient buffer broadcast device has been read by 1 and returning to Step 1);

Step 6): writing, by the operation control logic unit of the vector multiplier and accumulator device, BS filtering results currently obtained back into a multi-granularity filtering result storage unit and transmitting a shift signal to the coefficient buffer broadcast device;

Step 7): processing other data in the first BS rows in the matrix of data to be filtered similarly in accordance with Steps 1)-6); and Step 8): initializing the data cache device and the coefficient buffer broadcast device, and processing other data in the matrix of data to be filtered similarly in accordance with Steps 1)-7), until all the data in the matrix of data to be filtered have been processed;

wherein the initializing comprises reading the filtering coefficients from the multi-granularity filtering result storage unit to the data cache device and the coefficient buffer broadcast device.

* * * * *